Figure 1:
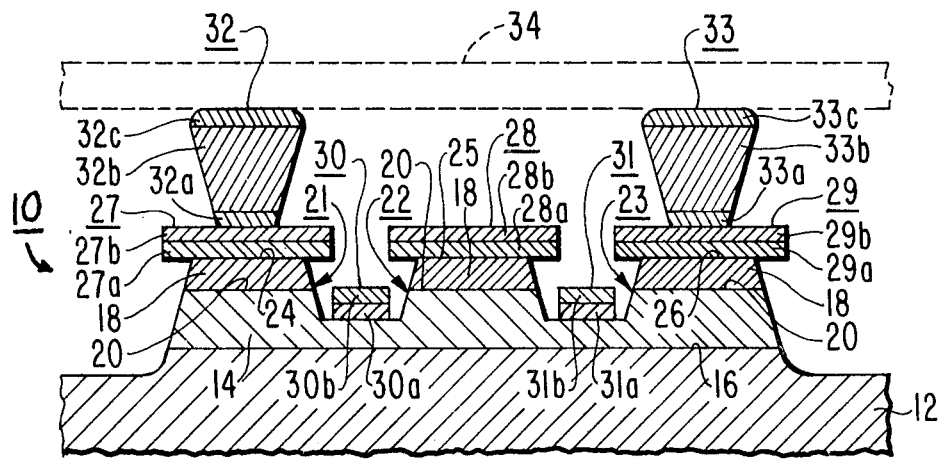

United States Patent [19]

Reichert

[11] 3,993,515
[45] Nov. 23, 1976

[54] METHOD OF FORMING RAISED ELECTRICAL CONTACTS ON A SEMICONDUCTOR DEVICE

[75] Inventor: Walter Francis Reichert, East Brunswick, N.J.

[73] Assignee: RCA Corporation, New York, N.Y.

[22] Filed: Mar. 31, 1975

[21] Appl. No.: 563,811

[52] U.S. Cl. .................................. 156/3; 156/13; 156/17; 156/18; 204/15; 204/23; 204/32 S; 204/38 B; 427/91
[51] Int. Cl.² ............... H01L 21/443; H01L 21/445
[58] Field of Search .................. 156/3, 13, 17, 18; 427/89, 91; 96/36.2; 29/578, 580, 579, 591; 204/15, 23, 32 S, 38 B, 46 G, 52 R

[56] References Cited
UNITED STATES PATENTS

| 3,653,999 | 4/1972 | Fuller | 156/17 |
| 3,689,332 | 9/1972 | Dietrich et al. | 156/17 |
| 3,761,785 | 9/1973 | Prunianx | 29/578 |
| 3,764,865 | 10/1973 | Napoli et al. | 29/578 |
| 3,809,625 | 5/1974 | Brown et al. | 204/15 |

*Primary Examiner*—Douglas J. Drummond
*Assistant Examiner*—Jerome W. Massie
*Attorney, Agent, or Firm*—H. Christoffersen; R. P. Williams; T. H. Magee

[57] ABSTRACT

Raised electrical contacts are electroplated on selected previously metallized contacts of a semiconductor device. Each metallized contact is on a surface of a separate mesa, respectively, of the device and extends in a cantilever manner beyond the surface of the mesa. The electroplating of the raised electrical contacts is accomplished by the steps of (1) depositing a layer of a metal over the device, (2) applying a photoresist over the layer of the metal, (3) defining openings in the photoresist over areas of the metallized contacts where the raised contacts are to be formed, and (4) electroplating the raised contacts on the metallized contacts through the openings, using the layer of the metal as an electrode in an electroplating system.

8 Claims, 5 Drawing Figures

METHOD OF FORMING RAISED ELECTRICAL CONTACTS ON A SEMICONDUCTOR DEVICE

The invention herein disclosed was made in the course of or under a contract or subcontract thereunder with the Department of the Army.

This invention relates generally to a method of forming raised electrical contacts on a semiconductor device. More particularly, the invention relates to a method of forming raised electrical contacts on a plurality of selected metallized contacts, each of the metallized contacts being on a surface of a separate mesa, respectively, of the semiconductor device.

The novel method is particularly useful for providing a semiconductor device with raised contacts so that the device can be utilized as a flip chip, in a manner well known in the semiconductor manufacturing art.

By the term "flip chip", as used herein, is meant a semiconductor device having raised electrical contacts on one side to permit flip (face down) mounting of the device in a circuit by connecting the raised contacts to required interconnectors of the circuit.

It has been proposed to provide raised electrical contacts on certain semiconductor devices by applying molten solder to metallized contacts of the device, whereby the solder would form bead-type leads suitable for use in a flip chip process. The application of molten solder, however, to certain semiconductor devices causes them to be raised to a temperature that may be detrimental to their structures. In certain semiconductor devices, for example, wherein the application of a temperature of greater than 150° C thereto would damage the device, the application of solder thereto to provide raised contacts is not practical.

It has also been proposed to provide raised contacts on a semiconductor device by the process of electroless plating. Electroless plating, however, is also not practical if the desired raised contacts are to be relatively high, that is, raised to more than a few micrometers above the surface of the semiconductor device.

The problem, also, of providing suitable raised electrical contacts on the surface of a semiconductor device wherein not all of the portions of the surface are coplanar is particularly difficult. This is particularly true where it is desired to provide raised electrical contacts on cantilever metallized contacts on mesas of a semiconductor device, such as one, for example, including a plurality of field-effect-transistors (FETs).

The novel method of forming raised electrical contacts on a device, having a non-planar surface, substantially overcomes the aforementioned disadvantages.

Briefly stated, the novel method of forming raised electrical contacts comprises the steps of (1) depositing an electrically continuous layer of metal onto the device, (2) applying a photoresist over the device, including the layer of metal, (3) defining openings in the photoresist over areas of the device where the raised contacts are to be formed, (4) electroplating the raised contacts on said areas through said openings, using the layer of metal as an electrode in an electroplating system, and (5) removing the photoresist and the layer of metal.

Figure 3:
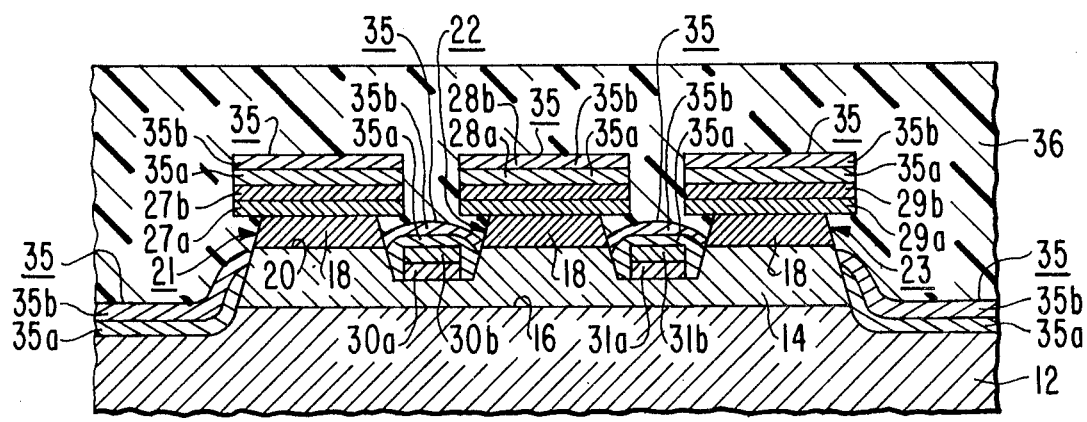
Figure 4:
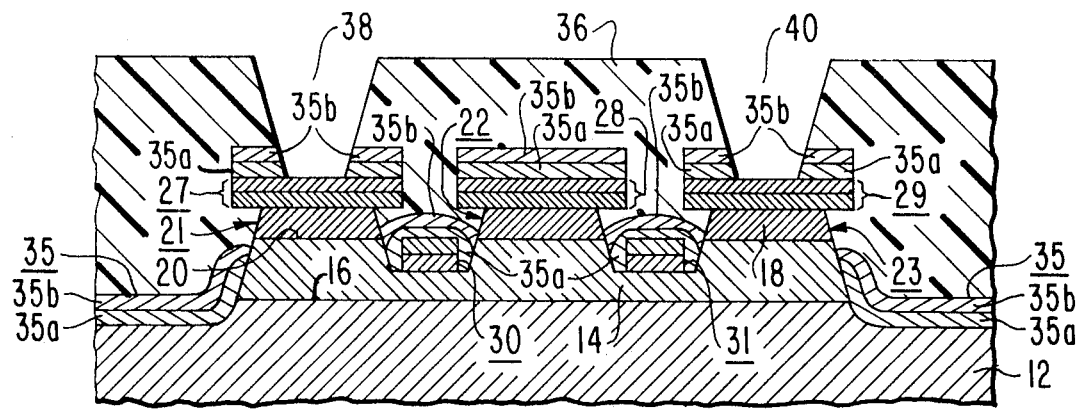
Figure 5:
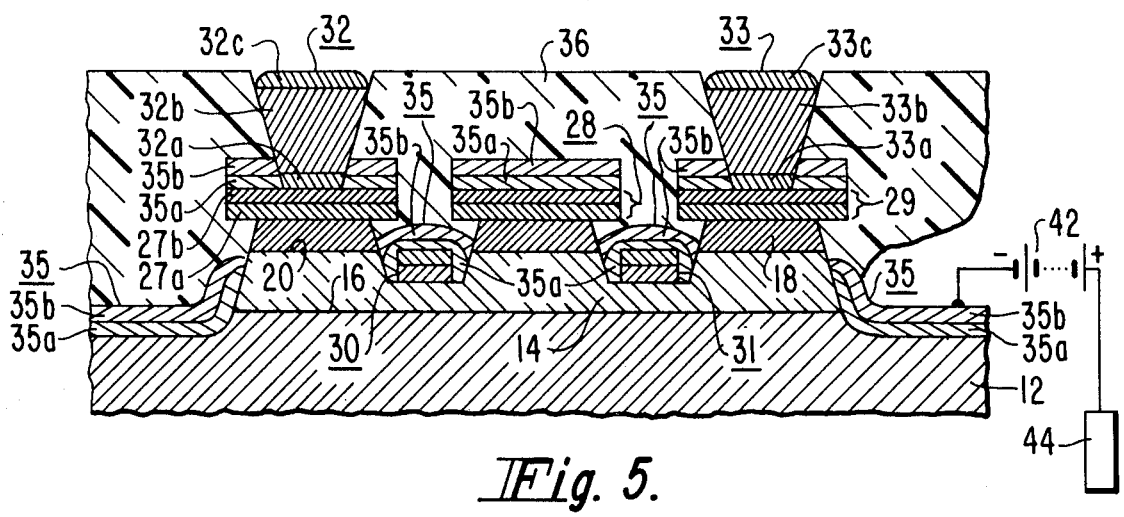

The novel method of forming raised electrical contacts on a semiconductor device will be described with the aid of the following drawings, wherein:

FIG. 1 is a fragmentary cross-sectional drawing of a completed semiconductor device, comprising a plurality of FETs, and illustrating raised electrical contacts formed on cantilever metallized contacts on separate mesas, respectively; and FIGS. 2–5 are fragmentary cross-sectional drawings of the device illustrated in FIG. 1, showing the device in different stages of the novel method of forming raised electrical contacts on areas of selected metallized contacts of the device; a portion of FIG. 5 is partly schematic to indicate an electroplating system.

Referring now to FIG. 1 of the drawing, there is shown a semiconductor device 10, comprising a plurality of Schottky barrier FETS on a single substrate 12. The Schottky barrier FETs of the device 10 are substantially similar in structure and operation to the semiconductor devices described in U.S. Pat. No. 3,764,865, for SEMICONDUCTOR DEVICES HAVING CLOSELY SPACED CONTACTS, and the patent is included herein by reference.

The substrate 12 comprises electrically insulating material, such as electrically high resistive germanium, silicon, or gallium arsenide, for example. An epitaxial layer 14 of a semiconductor material, such as silicon, germanium, or a group III-V compound material (i.e., gallium arsenide) is on a flat surface 16 of the substrate 12, which is part of a top surface of the substrate 12. The semiconductor layer 14 can be, for example, N type gallium arsenide having a carrier concentration of about $10^{17}$ cm$^{-3}$.

An epitaxial layer 18 of N type semiconductor material, such as gallium arsenide, having a carrier concentration of about $5 \times 10^{18}$ cm$^{-3}$, is formed on a surface 20 of the semiconductor layer 14.

A plurality of mesas 21, 22, and 23 are formed in the semiconductor layers 14 and 18; and the upper surfaces 24, 25, and 26 of the mesas 21, 22 and 23 are covered with metallized contacts 27, 28 and 29, respectively. A Schottky barrier electrode 30 is formed on the surface of the semiconductor layer 14 between the mesas 21 and 22; and a similar Schottky barrier electrode 31, is formed on the surface of the semiconductor layer 14 between the mesas 22 and 23. As illustrated, the metallized contacts 27–29 consist preferably of two layers, lower layers of titanium 27a–29a and upper layers of gold 27b–29b. The mesas 21 and 23 represent the source regions of the FETs and the mesa 22 is a drain region of the FETs.

The electrodes 30 and 31 also preferably consist of two layers of metal, the lower layers 30a and 31a being preferably layers of titanium and the upper layers 30b and 31b being preferably layers of gold. Although the materials of the preferred embodiments of the device 10, illustrated in FIG. 1, may differ slightly from those of the aforementioned patent, the novel method of forming raised electrical contacts on selected areas of these devices is substantially the same for all embodiments.

Raised electrical contacts 32 and 33 are electroplated over selected areas of the metallized contacts 27 and 29, respectively. The raised contact 32 comprises a flash coating 32a of gold electroplated on the metallized contact 27; a layer 32b of copper, forming the bulk of the raised contact 32; and a flash coating 32c over the layer 32b. Similarly, the raised contact 33 comprises a flash coating 33a of gold electroplated over the metallized contact 29, a layer 33b of copper electroplated on the flash coating 33a, and a coating 33c of gold electroplated on the copper layer 33b.

As shown in FIG. 1, the semiconductor device 10 is a flip chip in that the raised contacts 32 and 33, representing source region contacts of FETs, can be connected to conductors in an integrated circuit in a manner well known in the art. Thus, for example, the raised contacts 32 and 33 can be bonded to a planar metal strip 34 (shown in phantom), the metal strip 34 being a common connection comprising a gold covered copper conductor. By employing raised contacts 32 and 33, as shown in FIG 1, selected contacts of the semiconductor device 10 can be interconnected with an integrated circuit (represented by the strip 34) without other portions of the device 10, such as the metallized contact 28, for example, coming into contact with the integrated circuit.

Figure 2:
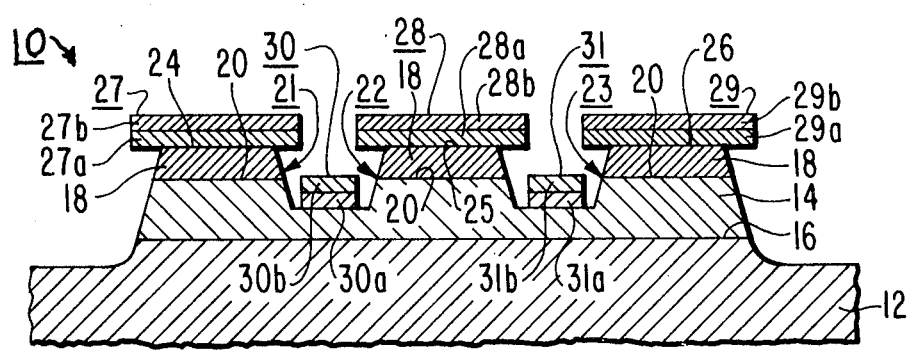

Referring now to FIG. 2 of the drawing, there is shown the structure of the semiconductor device 10, without any raised contacts thereon. The first step in the novel method of providing raised electrical contacts to the structure shown in FIG. 2 is depositing an electrically continuous layer 35 of a metal onto the device 10, as shown in FIG. 3. The layer 35 can be a single layer of a metal or a composite layer, such as a layer 35a of titanium having a thickness of about 500A, and a layer 35b of gold, having a thickness of 250A.

The layers 35a and 35b are deposited over the device 10 by chemical vapor deposition while the device 10 is maintained at room temperature. It is important to maintain the device 10 at room temperature during this operation because heat in excess of 150° C can destroy the FETs of the device 10, and also because the layers 35a and 35b can be removed sequentially at a faster rate than the raised contacts 32 and 33. It is also important that the composite layer 35 of metal be in electrical contact with the mesas 21 and 23, the latter mesas being electrically conductive. As shown in FIGS. 3–5, portions of the composite layer 35 look discontinuous but all portions of the composite layer 35 form one integral layer. The composite layer 35 is electrically continuous, that is, current is capable of flowing between any two points on the composite layer 35. The composite layer 35, however, need not be mechanically continuous, that is, it can be formed with mechanical discontinuities. Discontinuities in the form of holes are formed in the composite layer 35 because the contilevered metallized contacts 27–29 prevent deposition of metal on adjacent portions of the mesa.

The next step in the novel process is the application of a photoresist layer 36 over the semiconductor device 10, including the layer 35 of metal, as shown in FIG. 3. The thickness of photoresist layer 36 above the coplanar metallized contacts 27 and 29 should be at least as high as the desired raised contacts to be formed over the metallized contacts 27 and 29. The photoresist layer 36 may be a positive resist, for example, and may be applied in a manner well known in the art.

A plurality of openings, such as openings 38 and 40, for example, are formed by well-known photolithographic means in the photoresist layer 36 over areas of the metallized contacts 27 and 29, respectively, where the raised electrical contacts are to be formed, as shown in FIG. 4. Portions of the layers 35a and 35b over the metallized contacts 27 and 29, respectively, are also preferably etched away by suitable etchants, such as a cyanide-type etchant known as "Technistrip-Air" (Trademark of Technic Inc., Cranston, R.I.) for the gold layer 35b and buffered HF for the titanium layer 35a so that the raised contacts can be electroplated directly to the metallized contacts 27 and 29. Although the raised contacts 32 and 33 can be electroplated to the layers 35a and 35b, it is preferable to plate the raised contacts directly to the metallized contacts 27 and 29 to obtain the strongest bonds thereto.

The raised contacts 32 and 33 are now ready to be electroplated onto the device 10, as shown in FIG. 5. The composite layer 35 of metal is used as an electrode in an electroplating system wherein it is connected to the negative terminal of a source 42 of a voltage, shown in FIG. 5 for illustrative purposes as a battery. The positive terminal of the source 42 of voltage is connected to a suitable plating metal 44, first gold to electroplate the flash gold coatings 32a and 33a on the metallized contacts 27 and 29, respectively. The flash coatings 32a and 33a provide good bonds of the raised contacts 32 and 33 to the metallized contacts 27 and 29. A copper bar is now substituted for the plating metal 44 and the bulk of the raised contacts 32 and 33, in the form of copper layers 32b and 33b, is electroplated onto the flash gold coatings 32a and 33a. When the raised contacts 32 and 33 are substantially at the desired height they are given flash gold coatings 32c and 33c, respectively, to provide good contacts to a circuit onto which the device 10 is subsequently to be flip chipped.

After the raised contacts 32 and 33 are formed, the photoresist layer 36 is removed, in a manner well known in the semiconductor art. The composite layer 35 is next removed by etching it with an etchant that does not substantially affect the remainder of the device 10, such as, for example, the commercially available gold etchant, Technistrip (Trademark). Inasmuch as the gold layer 35b of the composite layer 35 was deposited onto the device 10 at room temperature, it can be etched away at a much faster rate than the gold layers 32c and 33c that were deposited by electroplating. With the aforementioned etchant, for example, the gold layer 35b is etched away at a rate of about thirty times as fast as the gold layers 32c and 33c. The layer of titanium 35a of the composite layer 35 is removed with a buffered HF solution, in a manner well known in the art, without affecting the gallium arsenide or the remaining metallization of the semiconductor device 10. The completed semiconductor device 10 with its raised electrical contacts 32 and 33 can now be flip-chipped onto an external circuit (i.e. represented by strip 34), as shown in FIG. 1, so that only the raised contacts 32 and 33 connect with the circuit, and other contacts, such as the metallized contact 28, for example, are separated from the circuit.

What is claimed is:

1. A method of forming raised electrical contacts on a plurality of selected metallized contacts of a semiconductor device including a plurality of mesas disposed on part of a top surface of an insulating substrate, at least some of said metallized contacts being on surfaces of electrically conductive mesas, and at least one of said metallized contacts extending beyond a surface of a mesa in a cantilever manner, said method comprising the steps of:

depositing an electrically continuous layer of a metal over said device including an exposed part of said top surface and in contact with at least portions of said mesas, applying a photoresist over said device, including metal, defining openings in said photoresist over areas of said metallized contacts where said raised contacts are to be formed, electroplating said raised contacts to said areas of said metallized contacts, through said openings, using said metal as an electrode in an electroplating system, and removing said photoresist and said metal not adjacent to said areas from said device.

2. A method of forming raised electrical contacts as described in claim 1, wherein:

said metallized contacts comprise a layer of gold over a layer of titanium, said metal comprises a composite layer of gold over a layer of titanium, and said metal is deposited by chemical vapor deposition on said metallized contacts at room temperature.

3. A method of forming raised electrical contacts as described in claim 1, wherein:

said mesas comprise semiconductor material chosen from the group consisting of germanium, silicon, and a III–V compound, said semiconductor device comprises a field effect transistor, and said method further includes the step of defining openings in said metal comprising removing portions of said metal from said areas after the step of defining openings in said photoresist over said areas of said metallized contacts.

4. A method of forming raised electrical contacts as described in claim 1, wherein:

the step of depositing an electrically continuous layer of a metal comprises first depositing a layer of titanium and then a layer of gold by chemical vapor deposition on said metallized contacts at room temperature, and the step of electroplating said raised contacts comprises electroplating said raised contacts mostly of copper.

5. A method of forming raised electrical contacts as described in claim 1, wherein:

the step of applying a photoresist over said device comprises applying the photoresist to a thickness substantially equal to at least the desired height of said raised contacts.

6. A method of forming raised electrical contacts as described in claim 1, including:

the step of etching away portions of said metal over said areas of metallized contacts after the step of defining openings in said photoresist, and the step of electroplating said raised contacts comprises (1) electroplating a flash coating of gold on said areas of said metallized contacts, (2) electroplating a layer of copper over said flash coating to form the bulk of said raised contacts, and (3) electroplating a coating of gold on the electroplated layer of copper.

7. A method of forming raised electrical contacts as described in claim 1 wherein:

the step of depositing an electrically continuous layer of a metal is by chemical vapor deposition of said metal on said device, said device being maintained at room temperature, and the step of removing said metal is with an etchant that does not substantially affect said device, said etchant etching said metal relatively much faster than said metallized contacts and said raised contacts.

8. A method of forming raised electrical contacts as described in claim 1, wherein:

said metallized contacts comprise a layer of gold over a layer of titanium, said mesas comprise gallium arsenide;

said metal comprises a layer of gold deposited over a layer of deposited titanium while maintaining said device at room temperature, said device comprises a plurality of field effect transistors, the step of applying a photoresist comprises applying said photoresist to a thickness substantially equal to at least the desired height of said raised contacts, portions of said metal over said areas are etched away prior to the step of electroplating, the step of electroplating comprises (1) electroplating a flash coating of gold on said areas of said metallized contacts, (2) electroplating a layer of copper over said flash coating of gold to substantially the height of said raised contacts, and (3) electroplating a coating of gold over said layer of copper, and the step of removing said metal comprises etching away said metal with an etchant that removes said metal at a substantially faster rate than said metallized contacts.

* * * * *